United States Patent [19]
McKeon et al.
[11] 3,927,332
[45] Dec. 16, 1975

[54] DRIVE CIRCUIT FOR CONTROLLING CONDUCTION OF A SEMICONDUCTOR DEVICE

[75] Inventors: Edward Francis Thomas McKeon, Short Hills; Michael Ray Martin, Somerville, both of N.J.

[73] Assignee: RCA Corporation, New York, N.Y.

[22] Filed: Feb. 24, 1975

[21] Appl. No.: 552,581

[52] U.S. Cl. .............. 307/252 C; 307/254; 307/268
[51] Int. Cl.$^2$ .......................................... H03K 17/72
[58] Field of Search ........ 307/252 C, 253, 254, 228, 307/300, 268

[56] References Cited

UNITED STATES PATENTS

| | | | |
|---|---|---|---|
| 3,194,979 | 7/1965 | Toy | 307/254 |
| 3,300,680 | 1/1967 | Saudinaitis | 307/252 C |
| 3,571,624 | 3/1971 | Leung | 307/300 X |

*Primary Examiner*—John Zazworsky
*Attorney, Agent, or Firm*—E. M. Whitacre; Paul J. Rasmussen

[57] ABSTRACT

A first transistor responsive to a source of signals is coupled to a first winding of a transformer and further coupled to a gate control electrode of a semiconductor device for turning the device off in response to the signals. A second winding of the transformer is coupled to a second transistor which is also coupled to the gate control electrode such that a change from a first to a second conduction state of the first transistor causes a current to be induced in the second winding which changes the conduction state of the second transistor for enabling conduction of the gated semiconductor device.

5 Claims, 5 Drawing Figures

DRIVE CIRCUIT FOR CONTROLLING CONDUCTION OF A SEMICONDUCTOR DEVICE

BACKGROUND OF THE INVENTION

This invention relates to a drive circuit for controlling the conduction of a semiconductor device.

In many circuit applications it is desirable to change the conduction state of active current conductive devices quickly, particularly when the devices are utilized as switches. Fast switching becomes more of a task as the amount of switched current and voltage increases to several amperes and several hundred volts. Such switching conditions are present in relatively high switching rate circuits such as the horizontal deflection circuits of television receivers. Suitable horizontal rate switching can be achieved by utilizing transistors or silicon controlled rectifiers as the switching elements.

A relatively new switching device called a gate-turn-off silicon controlled rectifier (hereinafter referred to as a GTO) is also suitable for the rapid switching of high voltages and currents such as occur in horizontal deflection circuits. Gate-turn-off silicon controlled rectifiers (GTO's) employ the same basic four-layer, three-junction regenerative semiconductor structure and exhibit a pulse turn-on capability similar to that of conventional silicon controlled rectifiers (SCR's). The GTO devices, however, differ from conventional SCR's in that they are designed to turn off with the application of a negative voltage to the gate electrode. It is not necessary to reduce the anode voltage to effect turn-off of a GTO, as is required for conventional SCR's.

The GTO also offers significant advantages in switching performance over power transistors. The most significant of these advantages is the inherent ability of the GTO to provide high blocking voltage and high switching currents with small-size semiconductor pellets. Moreover, although transistors can provide low on-state voltages [$V_{CE}$(sat)] for moderate current levels (i.e., in the order of 5 to 10 amperes), they are quickly driven into quasisaturation at currents beyond a specified maximum value. In contrast, comparable medium-current GTO's can maintain low on-state voltage ($V_T$) over a much wider current range (e.g., from 2 to 50 amperes). It is desirable to provide a drive circuit which is capable of effecting relatively fast switching of a device such as a power transistor or GTO by supplying suitable switching signals to the base or gate electrode of the particular device.

SUMMARY OF THE INVENTION

A drive circuit for switching the conduction state of a semiconductor switching device includes a first winding of a transformer coupled to be energized by a first active current conducting device and a second winding of the transformer coupled to control the conduction of a second active current conducting device. The first active device is coupled by capacitance means to a gate or control electrode of the semiconductor switching device for effecting turn-off of the switching device in response to a first conduction state of the first active device. The second active device is coupled to the gate or control electrode of the switching device for providing a source of drive current to enable conduction of the switching device in response to a second conduction state of the first active device.

A more complete description of the invention is given in the following description and accompanying drawing of which:

FIG. 1 is a circuit diagram of a drive circuit embodying the invention; and

FIGS. 2*a*–2*d* are normalized waveforms illustrating voltage and current at various points in the circuit of FIG. 1.

DESCRIPTION OF A PREFERRED EMBODIMENT OF THE INVENTION

Figure 1:
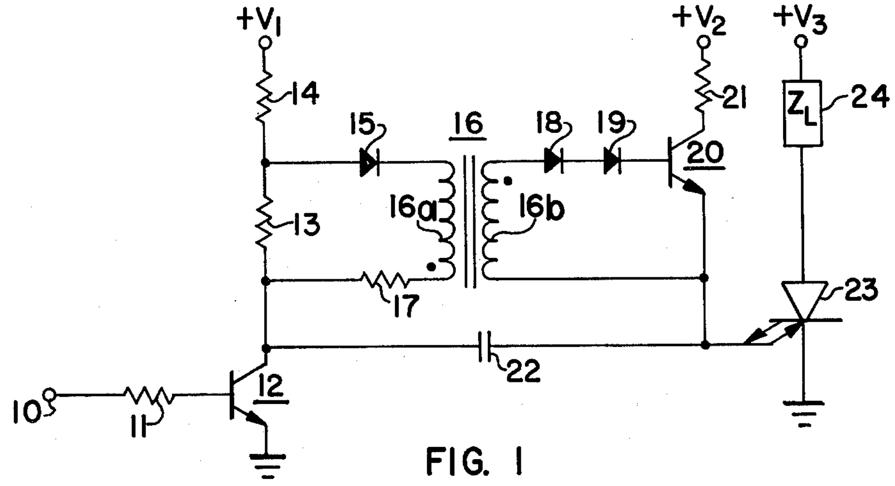
Figures 2A, 2B, 2C, 2D:
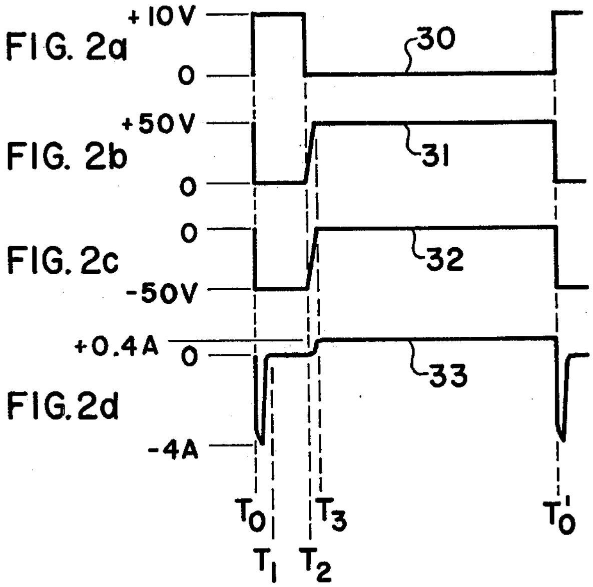

A source of drive waveforms, not shown, providing a drive waveform 30 as illustrated in FIG. 2*a* is coupled to a terminal 10 and through a resistor 11 to the base of a transistor 12. The collector of transistor 12 is coupled through serially coupled resistors 13 and 14 to a source of voltage $+V_1$, which may provide a direct current voltage of approximately +75 volts. The emitter of transistor 12 is grounded. The collector of transistor 12 is coupled through a capacitor 22 to the gate electrode of a GTO device 23. The cathode of GTO 23 is grounded and its anode is coupled through a load impedance 24 to a source of potential $+V_3$. Although load impedance 24 is illustrated as being serially coupled, it is to be understood that it may also be coupled in parallel with GTO 23, which acts as a switch for current through load impedance 24.

Coupled in parallel with resistor 13 is a series circuit comprising a recovery diode 15, a primary winding 16*a* of a transformer 16 and a resistor 17. A second transistor 20 has its collector coupled through a resistor 21 to a source of potential $+V_2$ which may provide a voltage of approximately +10 volts DC. Coupled in parallel with the base-emitter junction of transistor 20 is a series circuit comprising a secondary winding 16*b*, poled as indicated with respect to primary winding 16*a*, and diodes 18 and 19 which control current flowing into the base of transistor 20. Essentially, transistor 12 and capacitor 22 primarily control the turn-off of the gate electrode of GTO 23 and transistor 20 and its associated circuit control the forward drive current of GTO 23 to enable GTO 23 for conduction.

In operation, it is assumed that capacitor 22 has charged to a voltage of approximately +50 volts from the $+V_1$ supply through resistors 14 and 13. Waveform 30 coupled to terminal 10 causes NPN transistor 12 to assume its conducting state. The collector voltage of transistor 12 is illustrated by waveform 31 of FIG. 2*b*. It is noted transistor 12 conducts during the interval $T_0$ - $T_3$. Current flows from the $+V_1$ supply through resistor 14 and is divided between resistor 13 and its parallel circuit including winding 16*a* as determined by the relative impedances of the parallel circuit, and then through transistor 12 to ground. Conducting transistor 12 also provides a fast discharge path for current from capacitor 22. The drop in transistor 12 collector potential results in a similar voltage drop at the gate electrode of GTO 23. The gate voltage is illustrated by waveform 32 of FIG. 2*c*. The gate drops to approximately −50 volts during the interval $T_0$ - $T_3$. The relatively high voltage across capacitor 22 provides ample bias to quickly remove charge carriers from the gate to enable fast turn-off of GTO 23. The gate current of GTO 23 is illustrated by current waveform 33 of FIG. 2*d*. It can be seen that with the reverse bias across the gate-cathode junction of GTO 23, gate current is a relatively high value −4 amperes, for a relatively short time interval, $T_0$ - $T_1$. Once the gate carriers have been swept out, gate current remains at 0 for the duration of the negative bias interval, $T_1$ - $T_3$. Since the reverse biased GTO gate recovers in a high impedance state, capacitor 22 discharges very little during the interval $T_1$ - $T_3$. Because capacitor 22 is chosen to have a relatively large capacitance, in the order of 3.0 uf, most of the charge is retained in C22 during each television horizontal deflection cycle, providing the relatively high reverse bias during the gate discharge interval $T_0$ - $T_1$.

During the interval $T_0$ - $T_3$ that transistor 12 is conducting a voltage is induced in the secondary winding 16*b* of transformer 16. Diode 15 prevents any current in winding 16*b* from flowing in the base-emitter circuit of transistor 20. However, at $T_2$ the voltage waveform 30 returns to zero volts and by $T_3$ transistor 12 is cut off. The current in primary winding 16*a* discharges through diode 15, resistor 17 and resistor 13. The field in secondary winding 16*b* collapses setting up a positive voltage across diodes 18, 19 and the base-emitter junction of transistor 20, which quickly causes transistor 20 to conduct and saturate. Diodes 18 and 19 are optional and in this embodiment serve a waveshaping function by causing the drive voltage of transistor 20 to rise an additional 1.4 volts before transistor 20 conducts. The current path for transistor 20 is from the +V supply through resistor 21 and the gate-cathode junction of GTO 23. Thus, at $T_3$ forward current drive is applied to the gate electrode of GTO 23 to enable its main anode-cathode path to conduct load current. In the circuit illustrated, the forward gate current is approximately 0.4 amperes as illustrated by current waveform 33 in FIG. 2*d* during the interval $T_3$ - $T_0'$. It is noted that the charging of capacitor 22 once transistor 12 is nonconducting also supplies some drive to the gate electrode of GTO 23.

Because transistor 20 is held in saturation by the discharge of stored energy in winding 16*b*, there is very little dissipation in the drive circuit. Thus, the circuit input pulse 30 determines the GTO cutoff period by determining the GTO gate reverse bias period, and the negative transition of the input pulse 30 changes the conduction state of transistor 12 to enable transistor 20 to conduct to enable turn-on of GTO 23 by providing forward drive current to its gate electrode.

In FIGS. 2*a*–2*d*, the period $T_0$ - $T_3$ could be the retrace interval of a horizontal deflection cycle, and the interval $T_3$ - $T_0'$ could be a trace interval portion of each deflection cycle.

Although in the embodiment illustrated the switched device is a GTO 23, it is to be understood that a power transistor could be utilized in place of the GTO 23.

It is noted that the drive circuit produces two output pulses for one input pulse as illustrated by the GTO gate voltage and current waveforms in the intervals $T_0$ - $T_3$ and $T_3$ - $T_0'$, separated essentially by the input pulse 30 width. Further, utilization of transformer 16 prevents electrical field coupling which prevents transistor 20 from being biased on when a rapid $di/_{dt}$ in the circuit would otherwise produce charge flow in transistor 20 internal base regions which would result in a premature conduction of transistor 20.

What is claimed is:

1. A drive circuit for a gated semiconductor device, comprising:

first and second active current conducting devices;

a transformer including a first winding coupled to be energized by said first active device and a second winding coupled to control the conduction of said second active device;

a gated semiconductor device;

capacitance means coupled to said first active device and to a gate electrode of said gated semiconductor device for effecting turn-off of said gated semiconductor device in response to a first conduction state of said first active device;

said second active device being coupled to said gate electrode for providing drive current to enable conduction of said gated semiconductor device in response to a second conduction state of said first active device.

2. A drive circuit according to claim 1 wherein a unidirectional current conducting device is coupled in series with one of said first and second windings to prevent current flow in said second winding when said first active device is in said first conduction state.

3. A drive circuit according to claim 2 wherein said first and second active current conducting devices are transistors.

4. A drive circuit according to claim 3 wherein said gated semiconductor device is a gate-turn-off silicon controlled rectifier.

5. A drive circuit according to claim 1 wherein said first winding is coupled to said first active device by means including a unidirectional current conducting device for providing current flow in only one direction in said first and second windings.

* * * * *